(12) United States Patent
Koo et al.

(10) Patent No.: US 8,796,689 B2
(45) Date of Patent: Aug. 5, 2014

(54) THIN FILM TRANSISTOR ARRAY PANEL

(75) Inventors: Bon-Yong Koo, Cheonan-si (KR); Jeong Min Park, Seoul (KR); Ho Kyoon Kwon, Seoul (KR); Yun Hee Kwak, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 1 day.

(21) Appl. No.: 13/615,210

(22) Filed: Sep. 13, 2012

(65) Prior Publication Data

US 2013/0069069 A1 Mar. 21, 2013

(30) Foreign Application Priority Data

Sep. 21, 2011 (KR) .................. 10-2011-0095209

(51) Int. Cl.
*H01L 33/00* (2010.01)
(52) U.S. Cl.
USPC .................. 257/59; 257/72; 257/83
(58) Field of Classification Search
CPC ............ H01L 27/1214; H01L 27/3246; H01L 29/458; H01L 29/4908
USPC .............................. 257/59, 72, 83
See application file for complete search history.

(56) References Cited

U.S. PATENT DOCUMENTS

| | | | |
|---|---|---|---|
| 6,977,708 B2 | 12/2005 | Tanaka et al. | |
| 7,859,604 B2 | 12/2010 | Jeong et al. | |
| 7,965,285 B2 | 6/2011 | Kwak et al. | |
| 2006/0244893 A1 | 11/2006 | Oda | |
| 2007/0291042 A1 | 12/2007 | Kwak et al. | |
| 2008/0284968 A1 | 11/2008 | Hwang et al. | |
| 2011/0089423 A1 | 4/2011 | Kwon | |
| 2011/0140117 A1* | 6/2011 | Lee et al. .................. | 257/59 |

FOREIGN PATENT DOCUMENTS

| | | |
|---|---|---|
| JP | 2006146041 | 8/2006 |
| JP | 2007286119 | 11/2007 |
| KR | 1020050104800 | 11/2005 |
| KR | 100766895 | 10/2007 |
| KR | 100943730 | 2/2010 |
| KR | 1020100041429 | 4/2010 |

* cited by examiner

*Primary Examiner* — Tran Tran
(74) *Attorney, Agent, or Firm* — H.C. Park & Associates, PLC

(57) ABSTRACT

A thin film transistor array panel includes a gate line and the driver connection line formed with the same layer material, a data line and a driving pad formed with the same layer material, a first field generating electrode and a connecting member formed with the same layer material, and a second field generating electrode and a dummy electrode layer formed with the same layer material.

14 Claims, 13 Drawing Sheets

THIN FILM TRANSISTOR ARRAY PANEL

CROSS-REFERENCE TO RELATED APPLICATION

This application claims priority from and the benefit of Korean Patent Application No. 10-2011-0095209, filed on Sep. 21, 2011, which is hereby incorporated by reference for all purposes as if fully set forth herein.

BACKGROUND

1. Field

Exemplary embodiments of the present invention relate to a thin film transistor array panel.

2. Discussion of the Background

Among display panels, a liquid crystal display ("LCD") is one type of flat panel display that is currently being widely used, and includes two display panels in which field generating electrodes, such as a pixel electrode and a common electrode, etc., are formed, and a liquid crystal layer is disposed therebetween. The LCD displays images by applying voltages to the field-generating electrodes to generate an electric field in the liquid crystal ("LC") layer that determines the orientations of LC molecules therein to adjust the polarization of incident light. In the liquid crystal display, the pixel electrode and the common electrode generating an electric field to the liquid crystal layer may be formed on a thin film transistor array panel.

On the other hand, a chip-on-glass type directly mounting a data driving circuit to apply a data voltage to the field generating electrode of the liquid crystal display on the thin film transistor array panel has been proposed. When directly mounting the data driving circuit on the thin film transistor array panel through the chip-on-glass type, a driver connection line to connect a data pad unit of a data line and the data driving circuit may be formed of a gate wire or a data wire.

When forming the driver connection line of the gate wire, the driver connection line may be narrowly formed such that an area of a non-display area may be reduced. However, a thickness of a layer formed on the gate wire is correspondingly increased such that the connection with the driving circuit chip becomes difficult. Also, when forming the driver connection line of the data wire, the thickness of the layer formed on the data wire is small such that the connection with the driving circuit chip is easy. However, it is difficult to narrowly form the driver connection line such that the area of the non-display area is increased. However, a contact hole exposing the driver connection line is covered only by a connecting member made of a transparent conductor, and is therefore subject to corrosion.

The above information disclosed in this Background section is only for enhancement of understanding of the background of the invention and therefore it may contain information that does not form the prior art that is already known in this country to a person of ordinary skill in the art.

SUMMARY OF THE INVENTION

Exemplary embodiments of the present invention provide a thin film transistor array panel including a driver connection line for easy connection with a driving circuit chip while reducing an area of a non-display area of the chip.

Additional features of the invention will be set forth in the description which follows, and in part will be apparent from the description, or may be learned by practice of the invention.

An exemplary embodiment of the invention discloses a thin film transistor array panel including: a substrate having a display area and a peripheral area of the display area; a gate line disposed in the display area of the substrate; a driver connection line disposed in the peripheral area of the substrate; a gate insulating layer disposed on the gate line and the driver connection line; a data line disposed on the gate insulating layer and disposed in the display area of the substrate; a driving pad disposed on the gate insulating layer and disposed in the peripheral area of the substrate; a first insulating layer disposed on the data line and the driving pad; a first field generating electrode disposed on the first insulating layer and disposed in the display area of the substrate; a connecting member disposed on the first insulating layer and disposed in the peripheral area of the substrate; a second insulating layer disposed on the first field generating electrode and the connecting member; a second field generating electrode disposed on the second insulating layer and disposed in the display area of the substrate; and a dummy electrode layer disposed on the second insulating layer and disposed in the peripheral area of the substrate. The gate line and the driver connection line are formed of the same layer material, the data line and the driving pad are formed of the same layer material, the first field generating electrode and the connecting member are formed of the same layer material, and the second field generating electrode and the dummy electrode layer are formed of the same layer material.

The first insulating layer and the second insulating layer have a first contact hole exposing the driving pad, the gate insulating layer, the first insulating layer, and the second insulating layer have a second contact hole exposing the driver connection line, and the connecting member covers the first contact hole and the second contact hole.

A portion of the second insulating layer and the dummy electrode layer may be disposed on the second contact hole.

A bump may be disposed on the first contact hole.

A portion of the driver connection line may be disposed under the driving pad and they overlap each other.

The first insulating layer may include an organic insulator and a surface thereof is flat.

One of the first field generating electrode and the second field generating electrode may have a plate shape, and the other may include a branch electrode.

An exemplary embodiment of the present invention also discloses a thin film transistor array panel including: a substrate having a display area and a peripheral area of the display area; a gate line disposed in the display area of the substrate; a driver connection line disposed in the peripheral area of the substrate; a gate insulating layer disposed on the gate line and the driver connection line; a data line disposed on the gate insulating layer and disposed in the display area of the substrate; a plurality of driving pads disposed on the gate insulating layer in the peripheral area of the substrate; a first insulating layer disposed on the data line and the driving pad; a second insulating layer disposed on the first insulating layer in the display area of the substrate; a first field generating electrode disposed on the second insulating layer in the display area of the substrate; a third insulating layer disposed on the substrate on the first field generating electrode; a second field generating electrode disposed on the third insulating layer in the display area of the substrate; and a first connecting member disposed on the third insulating layer and covering the plurality of driving pads. The gate line and the driver connection lines are formed with the same layer material, the data line and the driving pad are formed with the same layer material, and the second field generating electrode and the first connecting member are formed with the same layer material.

An output line respectively extending from a plurality of driving pads may be further included, the first insulating layer and the third insulating layer may have a first contact hole exposing the driving pad and a second contact hole exposing the output line, the gate insulating layer, the first insulating layer, and the second insulating layer may have a third contact hole exposing the driver connection lines, and a second connecting member covering the second contact hole and the third contact hole may be further included, wherein the second connecting member may be formed with the same layer as the second field generating electrode.

Among a plurality of driving pads, two neighboring driving pads may be separated from each other in a vertical direction.

Among a plurality of driving pads, the output line may be disposed between two adjacent driving pads disposed on the same line in the horizontal direction.

A bump may be disposed on the first contact hole.

A portion of the driver connection lines may be disposed to be overlapped by the driving pad.

The second insulating layer may include an organic insulator and has a flat surface.

The second insulating layer may not be disposed in the peripheral area.

As described above, the thin film transistor array panel according to an exemplary embodiment of the present invention forms the driver connection line with the gate wire such that the driver connection line may be narrowly formed and the area of the non-display area may be reduced, the connection along with the driving circuit chip is formed with a dual layer of the gate wire and the data wire such that the driving circuit chip may be stably connected, and the upper portion of the driver connection line is covered and protected by the interlayer insulating layer and two electrode layers that overlap to each other via the interlayer insulating layer such that the corrosion of the driver connection line exposed by the contact hole may be prevented It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
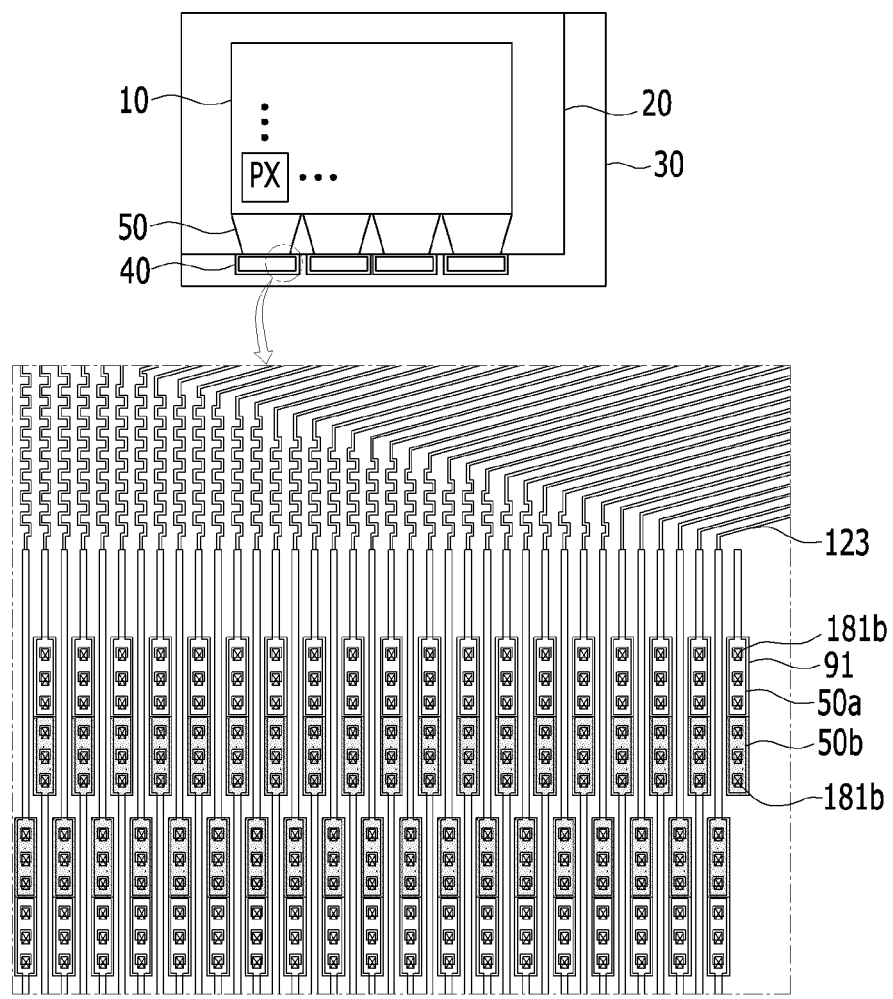
FIG. 1 is a layout view of a thin film transistor array panel according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

First, a thin film transistor array panel according to an exemplary embodiment of the present invention will be described with reference to FIG. 1. FIG. 1 is a layout view of a thin film transistor array panel according to an exemplary embodiment of the present invention.

Referring to FIG. 1, a thin film transistor array panel according to an exemplary embodiment of the present invention includes a plurality of pixels PX and includes a display area 10 to display images, a peripheral area 20 arranged at the periphery of the display area 10, and a driving region 30 disposed near the peripheral area 20. A driving circuit chip 40 is disposed in the driving region 30, and a driver connection unit 50 which connects a signal line disposed in the display area 10 and the driving circuit chip 40 of the driving region 30 is disposed in the peripheral area 20.

Referring to the enlarged view of a portion of the peripheral area 20 and the driving region 30, a plurality of driver connection lines 123 are disposed in the driver connection unit 50. A first driving input pad 50a and a first driving output pad 50b are disposed in the driving region 30. An end of the driver connection line 123 forms the first driving input pad 50a. A first driver contact hole 181a is formed to expose the first driving output pad 50b, and a second driver contact hole 181b is formed to expose the first driving input pad 50a. The first driving output pad 50b and the first driving input pad 50a that are respectively exposed through the first driver contact hole 181a and the second driver contact hole 181b are connected by a connecting member 91. The first driving output pad 50b is connected to the driving circuit chip 40 through a bump (shown later).

If a driving signal is output from the driving circuit chip 40 to the first driving output pad 50b, the output driving signal is transmitted to the first driving input pad 50a connected to the first driving output pad 50b through the connecting member 91. The driving signal input to the first driving input pad 50a is transmitted through the driver connection line 123, thereby being transmitted to the signal line of the pixel PX.

Figure 2:
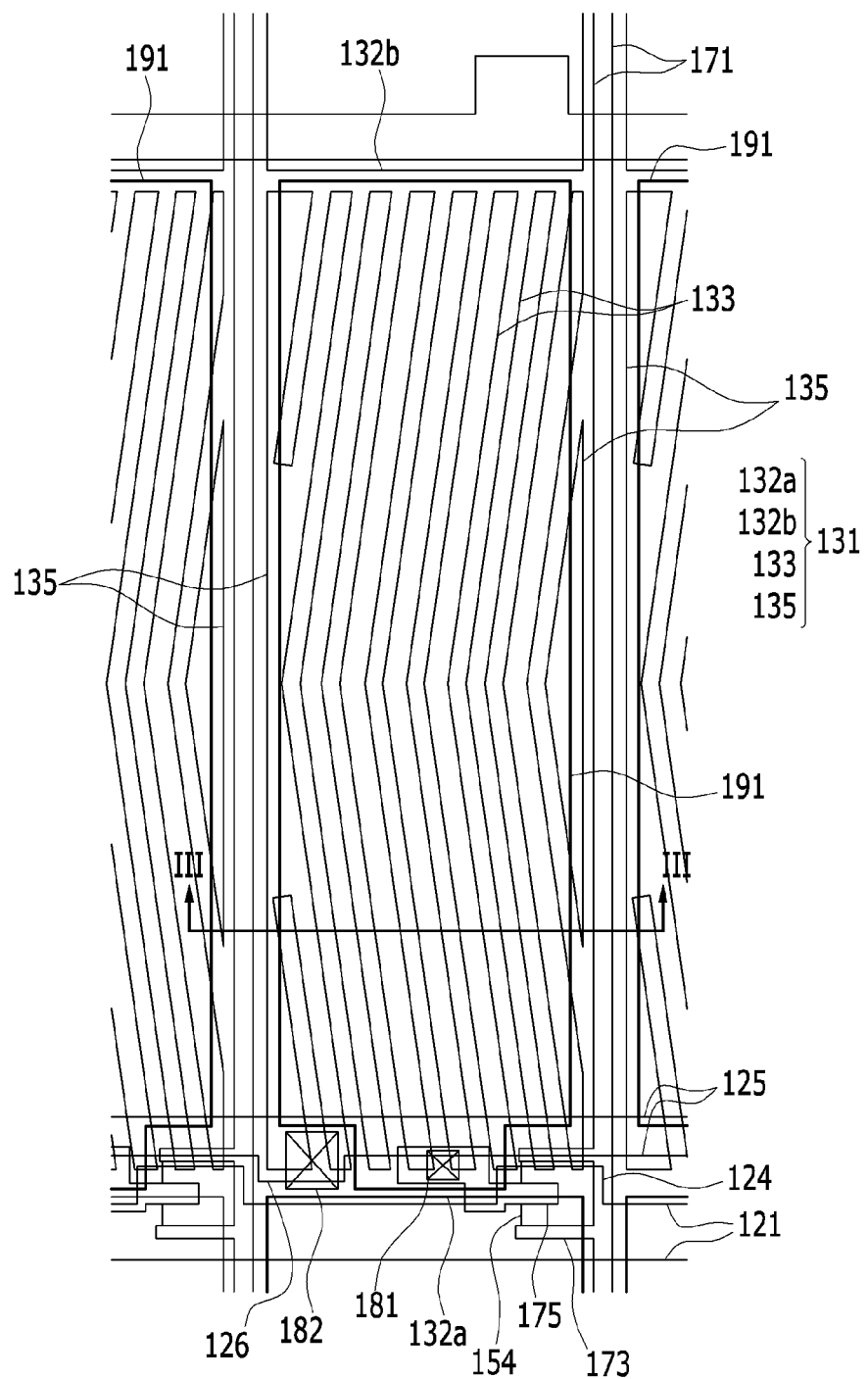
FIG. 2 is a layout view of one pixel of a display area of a thin film transistor array panel according to the first exemplary embodiment of the present invention.
Figure 3:
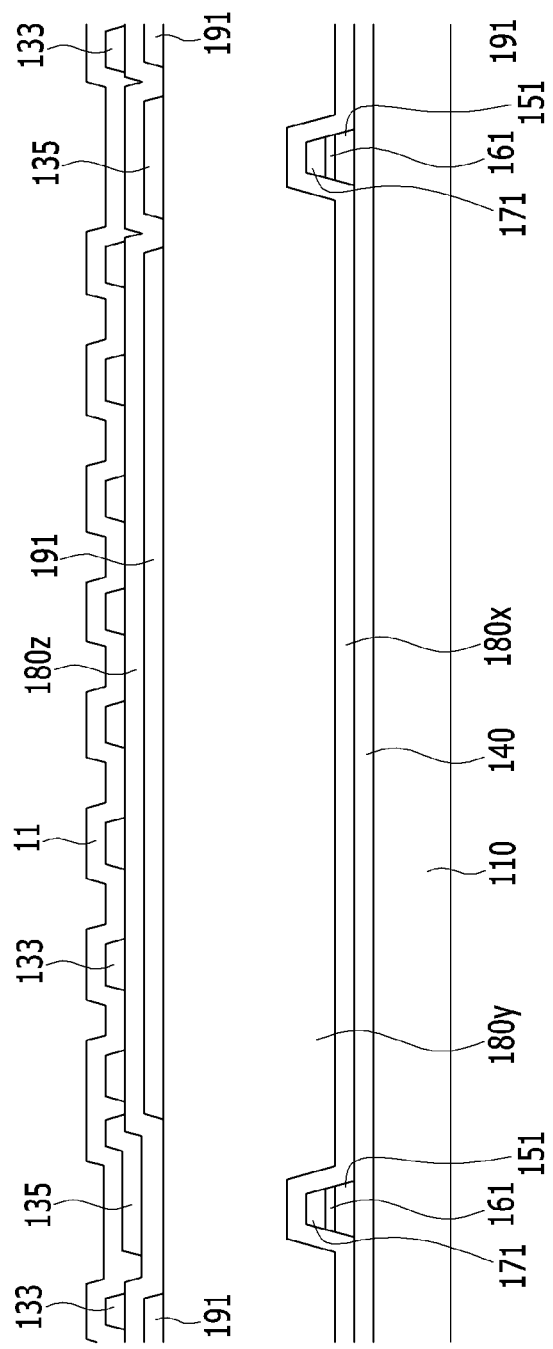
FIG. 3 is a cross-sectional view of the thin film transistor array panel taken along the line III-III of FIG. 2.
Figure 4:
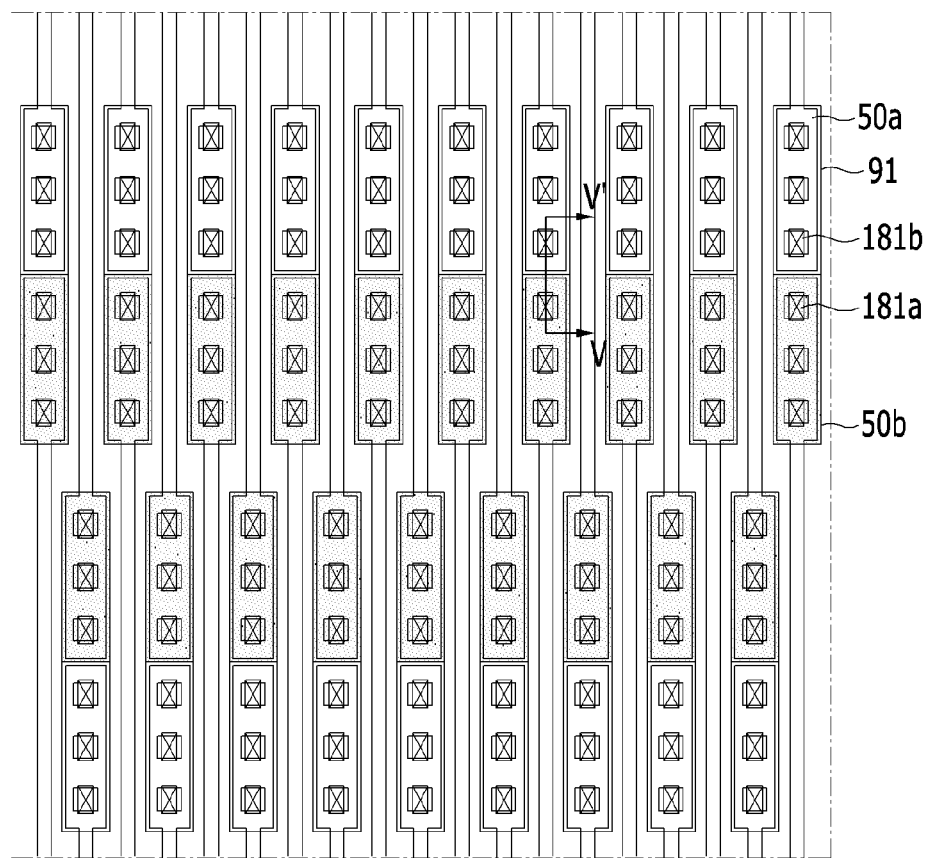
FIG. 4 is a layout view of a portion of a peripheral area and a driving region of a thin film transistor array panel according to the first exemplary embodiment of the present invention.
Figure 5:
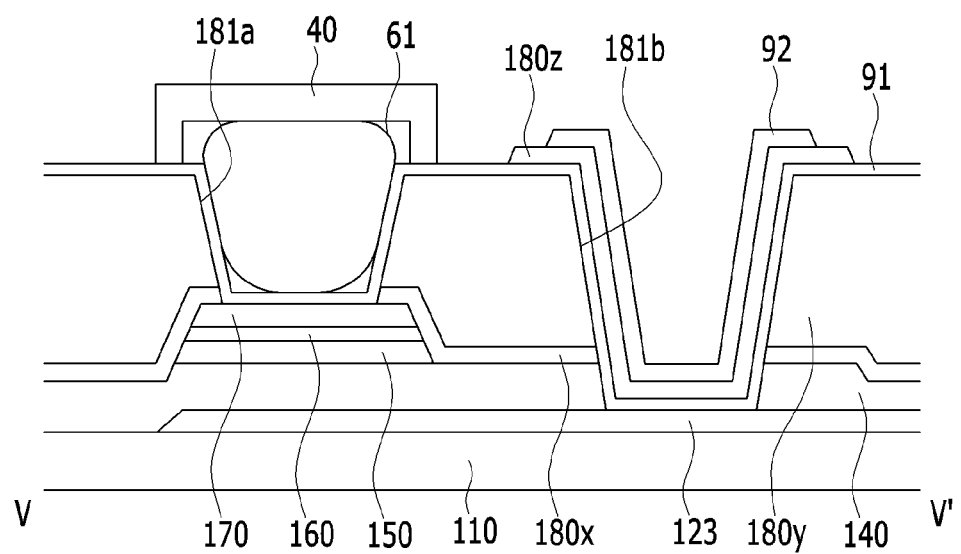
FIG. 5 is a cross-sectional view of the thin film transistor array panel taken along the line V-V' of FIG. 4.

Next, a thin film transistor array panel according to an exemplary embodiment of the present invention will be described with reference to FIG. 4 and FIG. 5 as well as FIG. 2 and FIG. 3. FIG. 2 is a layout view of one pixel of a display area of a thin film transistor array panel according to an exemplary embodiment of the present invention, and FIG. 3 is a cross-sectional view of the thin film transistor array panel taken along the line III-III of FIG. 2. FIG. 4 is a layout view of a portion of a peripheral area and a driving region of a thin film transistor array panel according to an exemplary embodiment of the present invention, and FIG. 5 is a cross-sectional view of the thin film transistor array panel taken along the line V-V' of FIG. 4.

First, a display area of a thin film transistor array panel according to an exemplary embodiment of the present invention will be described with reference to FIG. 2 and FIG. 3.

Referring to FIG. 2 and FIG. 3, a plurality of gate conductors including a plurality of gate lines 121 and a plurality of common voltage lines 125 are formed on an insulation substrate 110.

The gate lines 121 transmit gate signals and substantially extend in a transverse direction. Each gate line 121 includes a plurality of gate electrodes 124.

The common voltage line 125 may transfer a predetermined voltage such as common voltage Vcom, may extend substantially in a transverse direction, and may be substantially parallel with the gate line 121. Each common voltage line 125 may include a plurality of extensions 126.

A gate insulating layer 140 is formed on the gate conductors 121 and 125. The gate insulating layer 140 may be made of an inorganic insulating material, or the like, such as silicon nitride (SiNx), silicon oxide (SiOx), or the like.

A plurality of semiconductors 151 including a plurality of projections 154 are formed on the gate insulating layer 140. Ohmic contacts 161 may be disposed on the semiconductors 151, but the ohmic contacts may be omitted.

A data conductor including a plurality of data lines 171 and a plurality of drain electrodes 175 is formed on the ohmic contacts.

The data line 171 transmits data signals and substantially extends in a longitudinal direction to intersect the gate lines 121 and the common voltage lines 125. Each data line 171 includes a plurality of source electrodes 173 extending toward the gate electrode 124.

The drain electrode 175 includes a bar-type end facing the source electrode 173 with respect to the gate electrode 124 and the other end having a wide area.

The gate electrode 124, the source electrode 173, and the drain electrode 175 form a thin film transistor TFT as a switching element along with the exposed portions of the projections 154 of the semiconductor 151. The semiconductor 151 may have substantially the same plane as the data line 171 and the drain electrode 175 except for the channel of the thin film transistor.

A first passivation layer 180x is positioned on the data conductors 171 and 175 and the exposed portions of the projections 154, and the first passivation layer 180x may be made of an organic insulating material or an inorganic insulating material.

A second passivation layer 180y is positioned on the first passivation layer 180x. The second passivation layer 180y includes an organic material and may be formed on the whole surface of the substrate 110 while covering the data lines 171. The surface of the second passivation layer 180y may be substantially flat.

The first passivation layer 180x and the second passivation layer 180y have a first contact hole 181 exposing a portion of the drain electrode 175.

A plurality of pixel electrodes 191 are positioned on the second passivation layer 180y. Each pixel electrode 191 may have a plane shape filling most of the region enclosed by the gate line 121 and the data line 171. The entire shape of the pixel electrode 191 may be a polygon having edges substantially parallel to the gate line 121 and the data line 171 and both lower edges where the thin film transistor is positioned may be chamfered, however it is not limited thereto. The pixel electrode 191 may be made of a transparent conductive material such as ITO or IZO. The pixel electrode 191 receives a data voltage from the drain electrode 175, which is connected to the pixel electrode 191 via the first contact hole 181.

A third passivation layer 180z is formed on the pixel electrode 191. The third passivation layer 180z may be made of an inorganic insulator or an organic insulator. The third passivation layer 180z, the second passivation layer 180y, the first passivation layer 180x, and the gate insulating layer 140 have a plurality of second contact holes 182 exposing a portion of the common voltage line 125 (e.g., a portion of the extension 126).

A plurality of common electrodes 131 are formed on the third passivation layer 180z. The common electrodes 131 may be made of the transparent conductive material such as ITO or IZO.

Each common electrode 131 includes a pair of longitudinal portions 135 covering the data line 171, a plurality of branch electrodes 133 positioned between two longitudinal portions 135 and separated from each other, and a lower transverse portion 132a and an upper transverse portion 132b connecting ends of a plurality of branch electrodes 133. The longitudinal portion 135 is substantially parallel to the data line 171 and overlaps the data line 171 while covering it. The lower and upper transverse portions 132a and 132b are substantially parallel to the gate line 121. A plurality of branch electrodes 133 are substantially parallel to each other and form an oblique angle with respect to the extending direction of the gate line 121, and the oblique angle may be more than 45 degrees. The branch electrode 133 at the upper side and the branch electrode 133 at the lower side may be inversely symmetrical with respect to an imaginary transverse center line of the common electrode 131. The neighboring common electrodes 131 are connected to each other while sharing one longitudinal portion 135. The common electrode 131 receives a voltage such as a common voltage Vcom from the common voltage line 125 through the second contact hole 182. The common electrode 131 according to an exemplary embodiment of the present invention overlaps the pixel electrode 191. Particularly, at least two neighboring branch electrodes 133 of the common electrode 131 overlap one pixel electrode 191 having a plane shape.

Next, a portion of the peripheral area and the driving region of the thin film transistor array panel according to an exemplary embodiment of the present invention will be described with reference to FIG. 4 and FIG. 5.

Referring to FIG. 4 and FIG. 5, a plurality of driver connection lines 123 are formed on the insulation substrate 110. The driver connection lines 123 may be made of the gate conductor material. The end of the driver connection line 123 forms the first driving input pad 50a.

The gate insulating layer 140 is formed on the driver connection line 123. The first driving output pad 50b is formed on the gate insulating layer 140. A portion of the driver connection line 123 is extended and disposed under the first driving output pad 50b. The first driving output pad 50b includes a first layer 150, which may be formed with the same layer material as the semiconductor 151 of the display area, a second layer 160, which may be formed with the same layer material as the ohmic contact of the display area, and a third layer 170, which may be made of the data conductor material of the display area. The second layer 160 may be omitted.

The first passivation layer 180x is formed on the first driving output pad 50b and the gate insulating layer 140. The second passivation layer 180y is positioned on the first passivation layer 180x. The first passivation layer 180x and the second passivation layer 180y have the first driver contact hole 181a exposing the first driving output pad 50b, and the first passivation layer 180x, the second passivation layer 180y, and the gate insulating layer 140 have the second driver contact hole 181b exposing the first driving input pad 50a of the driver connection line 123. The first driving output pad 50b and the first driving input pad 50a, which are respectively exposed through the first driver contact hole 181a and the second driver contact hole 181b, are connected by the connecting member 91.

The connecting member 91 may be formed with the same layer material as the pixel electrode 191 of the display area.

A bump 61 is disposed on the connecting member 91 disposed at the position corresponding to the first driving output pad 50b. Through the bump 61, the driving circuit chip 40 and the first driving output pad 50b are electrically connected to each other.

The third passivation layer 180z is disposed on the connecting member 91 disposed at the position corresponding to the first driving input pad 50a, and a dummy electrode layer 92 formed with the same layer material as the common electrode 131 is disposed on the third passivation layer 180z.

In the case of the thin film transistor array panel according to the present exemplary embodiment, the first driving output pad 50b where the driving signal is output from the driving circuit chip 40 includes a layer made of the data conductor material of the display area. Accordingly, compared with a case of forming the first driving output pad 50b with the gate conductor material, a depth of the first driver contact hole 181a exposing the first driving output pad 50b is not relatively large. Also, the layer made of the gate conductor material is disposed under the first driving output pad 50b made of the data conductor material such that the depth of the first driver contact hole 181a may be further reduced. Accordingly, the interval between the driving circuit chip 40 and the first driving output pad 50b is small such that the connection using bump 61 is easy. Also, in the case of the thin film transistor array panel according to the present exemplary embodiment, the driver connection line 123 connecting the driving circuit chip 40 and the display area is formed with the gate conductor material through one etch process such that the width may be small compared with the driver connection line 123 being formed with the data conductor material, and thereby the width of the peripheral area near the display area may be reduced.

Also, in the case of the thin film transistor array panel according to the present exemplary embodiment, the second driver contact hole 181b exposing the first driving input pad 50a as the end of the driver connection line 123 is covered and protected by the third passivation layer 180z as the interlayer insulating layer disposed between the pixel electrode 191 and the common electrode 131; the dummy electrode layer 92 made with the same layer material as the common electrode 131; and the connecting member 91 made with the same layer material as the pixel electrode 191. Thereby, corrosion of the driver connection line 123 may be prevented.

Figure 6:
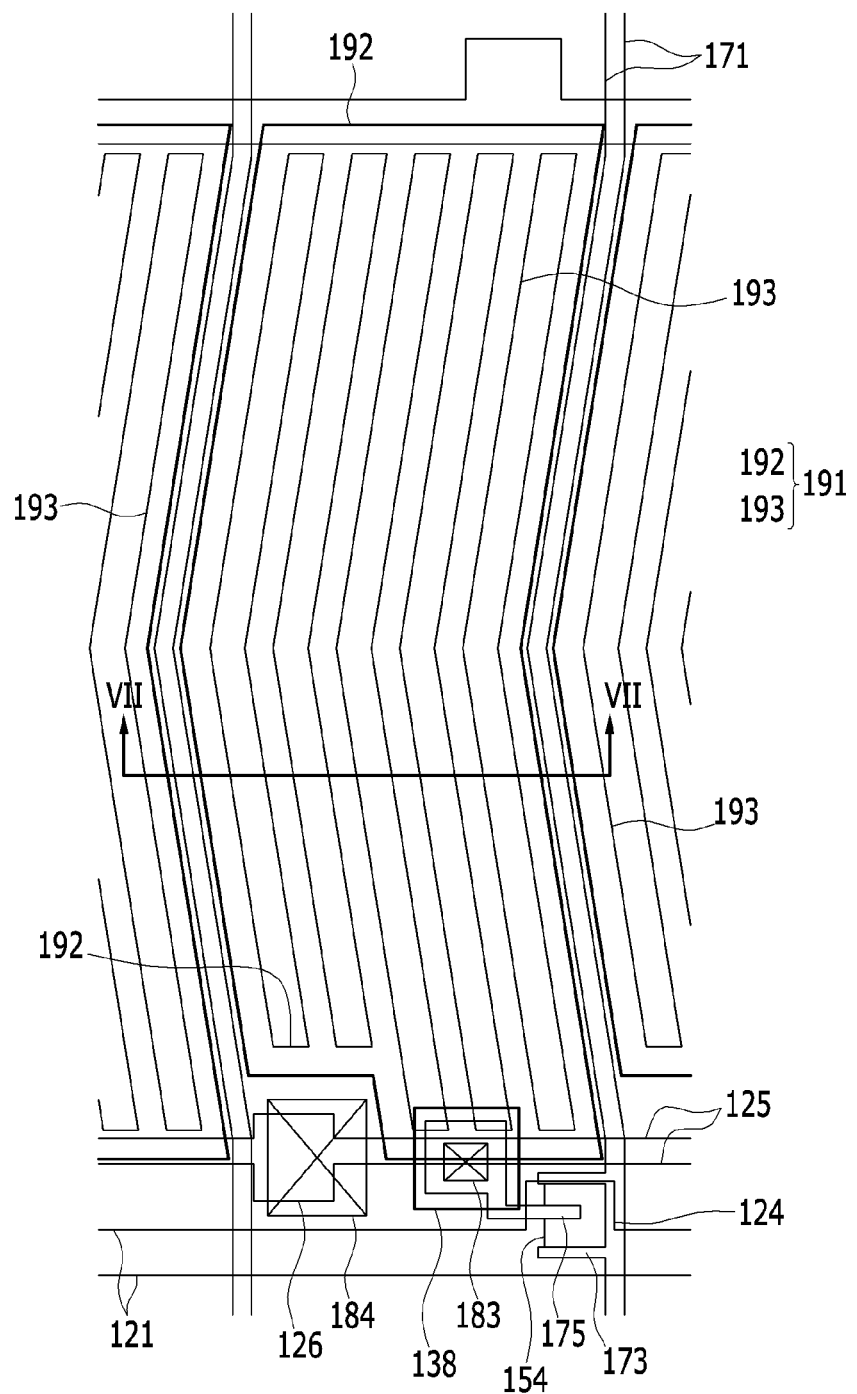
FIG. 6 is a layout view of one pixel of a display area of a thin film transistor array panel according to a second exemplary embodiment of the present invention.
Figure 7:
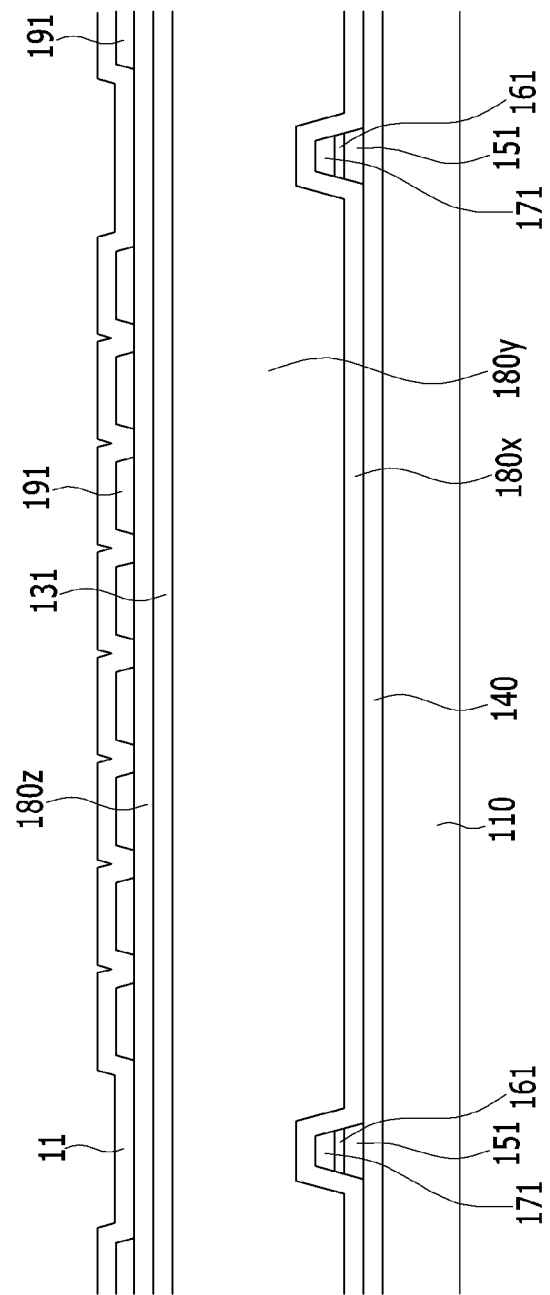
FIG. 7 is a cross-sectional view of the thin film transistor array panel taken along the line VII-VII of FIG. 6.
Figure 8:
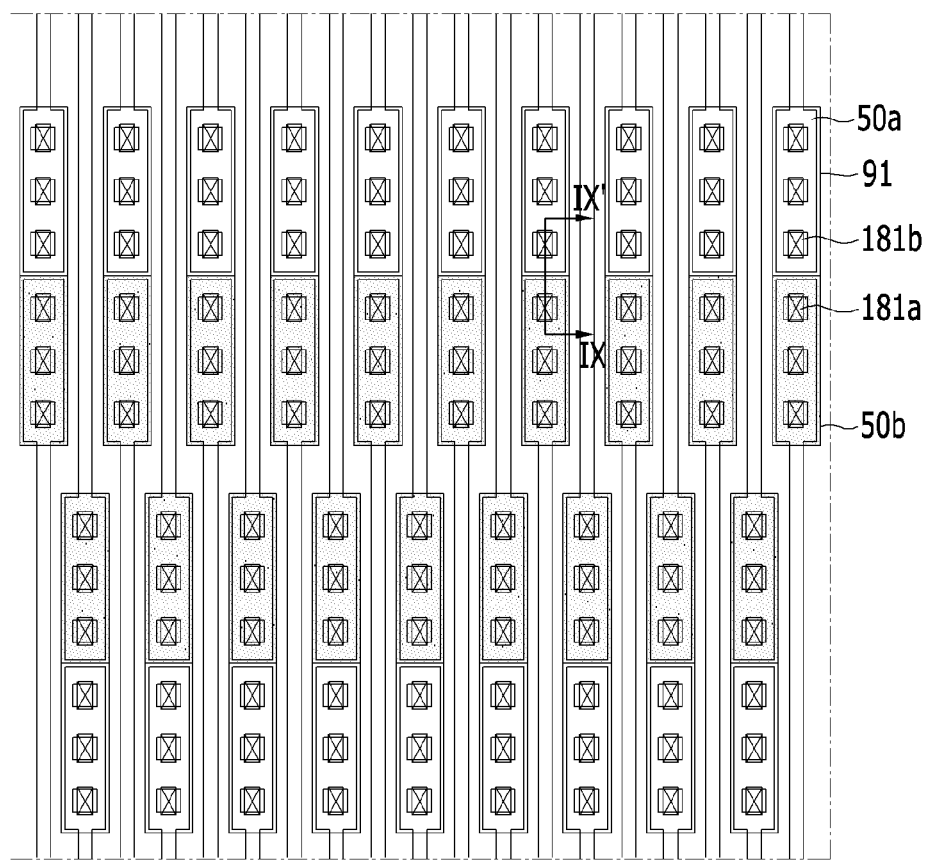
FIG. 8 is a layout view of a portion of a peripheral area and a driving region of a thin film transistor array panel according to a third exemplary embodiment of the present invention.
Figure 9:
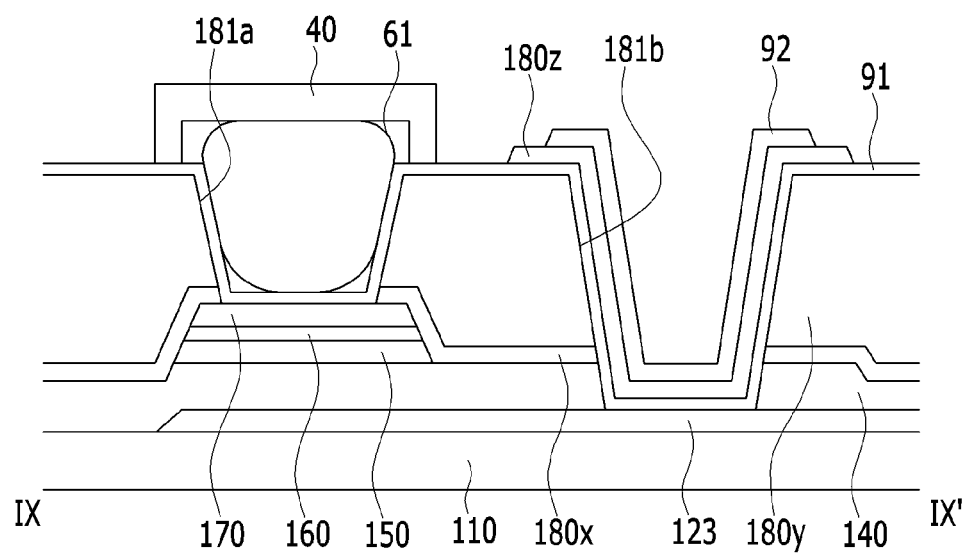
FIG. 9 is a cross-sectional view of the thin film transistor array panel taken along the line IX-IX' of FIG. 8.

Next, a thin film transistor array panel according to another exemplary embodiment of the present invention will be described with reference to FIG. 8 and FIG. 9 as well as FIG. 6 and FIG. 7. FIG. 6 is a layout view of one pixel of a display area of a thin film transistor array panel according to another exemplary embodiment of the present invention, and FIG. 7 is a cross-sectional view of the thin film transistor array panel taken along the line VII-VII of FIG. 6. FIG. 8 is a layout view of a portion of a peripheral area and a driving region of a thin film transistor array panel according to an exemplary embodiment of the present invention, and FIG. 9 is a cross-sectional view of the thin film transistor array panel taken along the line IX-IX' of FIG. 8.

First, a display area of a thin film transistor array panel according to another exemplary embodiment of the present invention will be described with reference to FIG. 6 and FIG. 7.

Referring to FIG. 6 and FIG. 7, the display area of the thin film transistor array panel according to the present exemplary embodiment is the same as most of the display area of the thin film transistor array panel shown in FIG. 2 and FIG. 3. A plurality of gate conductors including a plurality of gate lines 121 and a plurality of common voltage lines 125 are formed on an insulation substrate 110.

A gate insulating layer 140 is formed on the gate conductors 121 and 125.

A plurality of semiconductors 151 including a plurality of projections 154 are formed on the gate insulating layer 140. An ohmic contact 161 may be disposed on the semiconductor 151, but the ohmic contact may be omitted.

A data conductor including a plurality of data lines 171 and a plurality of drain electrodes 175 is formed on the ohmic contact. In contrast to the thin film transistor array panel according to the exemplary embodiment shown in FIG. 2 and FIG. 3, the data line 171 of the thin film transistor array panel according to the present exemplary embodiment is periodically bent, thereby forming an oblique angle by the extending direction of the gate line 121. The oblique angle between the data line 171 and the extending direction of the gate line 121 may be more than 45 degrees.

A gate electrode 124, the source electrode 173, and the drain electrode 175 form the thin film transistor as the switching element along the exposed portion of the projections 154 of the semiconductor 151. The semiconductor 151 may have almost the same plane shape as the data line 171 and the drain electrode 175 except for the channel of the thin film transistor.

A first passivation layer 180x is positioned on the data conductors 171 and 175 and the exposed portions of the projections 154, and the first passivation layer 180x may be made of the organic insulating material or the inorganic insulating material.

A second passivation layer 180y is positioned on the first passivation layer 180x. The second passivation layer 180y includes the organic material and covers the data line 171, and may be formed on the entire surface of the substrate 110. The surface of the second passivation layer 180y may be substantially flat.

The first passivation layer 180x and the second passivation layer 180y have a fourth contact hole 183 exposing a portion of the drain electrode 175, and the first passivation layer 180x, the second passivation layer 180y and the gate insulating layer 140 have a third contact hole 184 exposing a portion of the common voltage line 125.

A common electrode 131 is formed on the second passivation layer 180y. The common electrode 131 is electrically connected to the common voltage line 125 through the third contact hole 184, thereby receiving the predetermined voltage such as the common voltage Vcom from the common voltage line 125. The common electrode 131 has an opening 138 exposing a contact hole 183 described later. In the present exemplary embodiment, the common electrode 131 may be formed with a single plate on the entire surface of the substrate 110.

A third passivation layer 180z is formed on the common electrode 131, and a pixel electrode 191 is formed thereon. The first passivation layer 180x, the second passivation layer 180y, and the third passivation layer 180z have a plurality of fourth contact holes 183 exposing a portion of the drain electrode 175, and the pixel electrode 191 is electrically connected to the drain electrode 175 through the third contact hole 184 and the fourth contact hole 183, thereby receiving the data voltage. The pixel electrode 191 includes a plurality of branch electrodes 193 substantially parallel to each other and separated from each other, and lower and upper transverse portions 192 connecting upper and lower ends of the branch electrode 193. The branch electrodes 193 of the pixel electrode 191 may be bent similarly to the data line 171.

The data voltage applied to the pixel electrode 191 and the common voltage applied to the common electrode 131 generate an electric field to the liquid crystal layer.

Next, a peripheral area of a thin film transistor array panel according to another exemplary embodiment of the present invention will be described with reference to FIG. 8 and FIG. 9.

Referring to FIG. 8 and FIG. 9, the peripheral area and the driving region of the thin film transistor array panel according to the present exemplary embodiment is the same as most of the display area of the thin film transistor array panel shown in FIG. 4 and FIG. 5.

Referring to FIG. 8 and FIG. 9, a plurality of driver connection lines 123 are formed on the insulation substrate 110. The driver connection line 123 may be made of the gate conductor material. The end of the driver connection line 123 forms a first driving input pad 50a.

The gate insulating layer 140 is formed on the driver connection line 123. A first driving output pad 50b is formed on the gate insulating layer 140. A portion of the driver connection line 123 is extended under the first driving output pad 50b. The first driving output pad 50b includes a first layer 150, which may be made with the same layer material as the semiconductor 151 of the display area, a second layer 160, which may be made with the same layer material as the ohmic contact of the display area, and a third layer 170, which may be made of the data conductor material of the display area. Here, the second layer 160 may be omitted.

The first passivation layer 180x is disposed on the first driving output pad 50b and the gate insulating layer 140. The second passivation layer 180y is positioned on the first passivation layer 180x. The first passivation layer 180x and the second passivation layer 180y have a first driver contact hole 181a exposing the first driving output pad 50b, and the first passivation layer 180x, the second passivation layer 180y, and the gate insulating layer 140 have a second driver contact hole 181b exposing the first driving input pad 50a of the driver connection line 123. The first driving output pad 50b and the first driving input pad 50a, which are respectively exposed through the first driver contact hole 181a and the second driver contact hole 181b are connected by a connecting member 91.

The connecting member 91 may be made with the same layer as the common electrode 131 of the display area.

A bump 61 is disposed on the connecting member 91 disposed at the position corresponding to the first driving output pad 50b. Through the bump 61, the driving circuit chip 40 and the first driving output pad 50b are electrically connected to each other.

The third passivation layer 180z is disposed on the connecting member 91 disposed at the position corresponding to the first driving input pad 50a, and a dummy electrode layer 92 made with the same layer material as the pixel electrode 191 is disposed on the third passivation layer 180z.

In the case of the peripheral area of the thin film transistor array panel according to the present exemplary embodiment, differently from the peripheral area of the thin film transistor array panel according to the exemplary embodiment shown in FIG. 4 and FIG. 5, the connecting member 91 is made with the same layer material as the common electrode 131, and the dummy electrode layer 92 is made with the same layer material as the pixel electrode 191.

In the case of the thin film transistor array panel according to the present exemplary embodiment, the first driving output pad 50b outputting the driving signal from the driving circuit chip 40 includes the data conductor of the display area. Accordingly, compared with the case of forming the first driving output pad 50b with the gate conductor, the depth of the first driver contact hole 181a exposing the first driving output pad 50b is not large. Also, a layer made of the gate conductor is disposed under the first driving output pad 50b made of the data conductor such that the depth of the first driver contact hole 181a may be further decreased. Accordingly, the interval between the driving circuit chip 40 and the first driving output pad 50b is not large, and thereby the connection using the bump 61 is easy. Also, in the case of the thin film transistor array panel according to the present exemplary embodiment, the driver connection line 123 connecting the driving circuit chip 40 and the display area is formed with the gate conductor through one etching process such that the width is narrowly formed compared with a data conductor formed through two etching processes, and thereby the area of the peripheral area near the display area may be reduced.

Also, in the case of the thin film transistor array panel according to the present exemplary embodiment, the second driver contact hole 181b exposing the first driving input pad 50a as the end of the driver connection line 123 is covered and protected by the third passivation layer 180z as the interlayer insulating layer disposed between the pixel electrode 191 and the common electrode 131; the dummy electrode layer 92 made with the same layer material as the pixel electrode 191; and the connecting member 91 made with the same layer material as the common electrode 131, thereby preventing the corrosion of the driver connection line 123. That is, in the case of the peripheral area of the thin film transistor array panel according to an exemplary embodiment of the present invention, the driver connection line 123 exposed through the contact hole is covered and protected by the connecting member 91 made with the same layer material as one of two field generating electrodes 191 and 131; the third passivation layer 180z as the interlayer insulating layer between the two field generating electrodes 191 and 131; and the dummy electrode layer 92 made with the same layer material as one of the two field generating electrodes 191 and 131.

Figure 10:
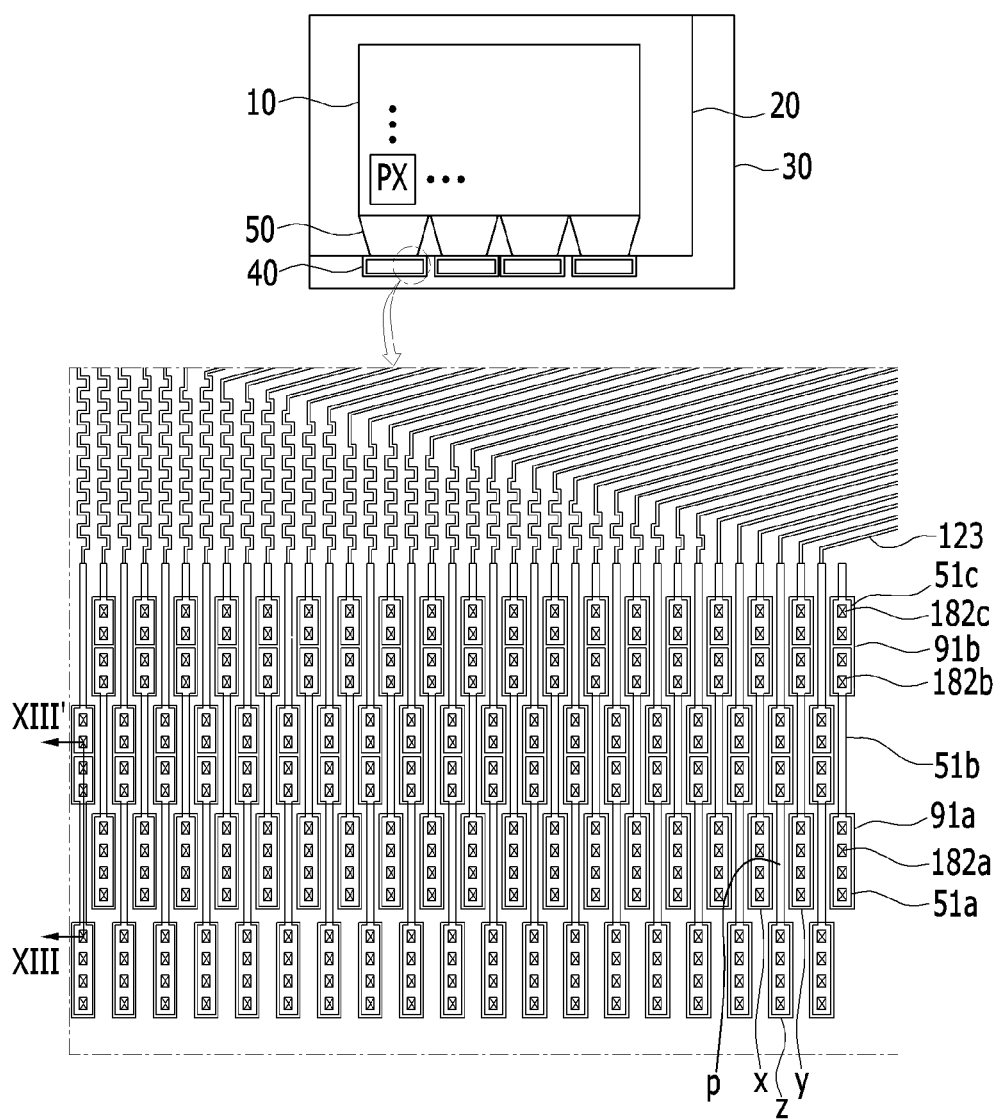
FIG. 10 is a layout view of a thin film transistor array panel according to a fourth exemplary embodiment of the present invention.
Figure 11:
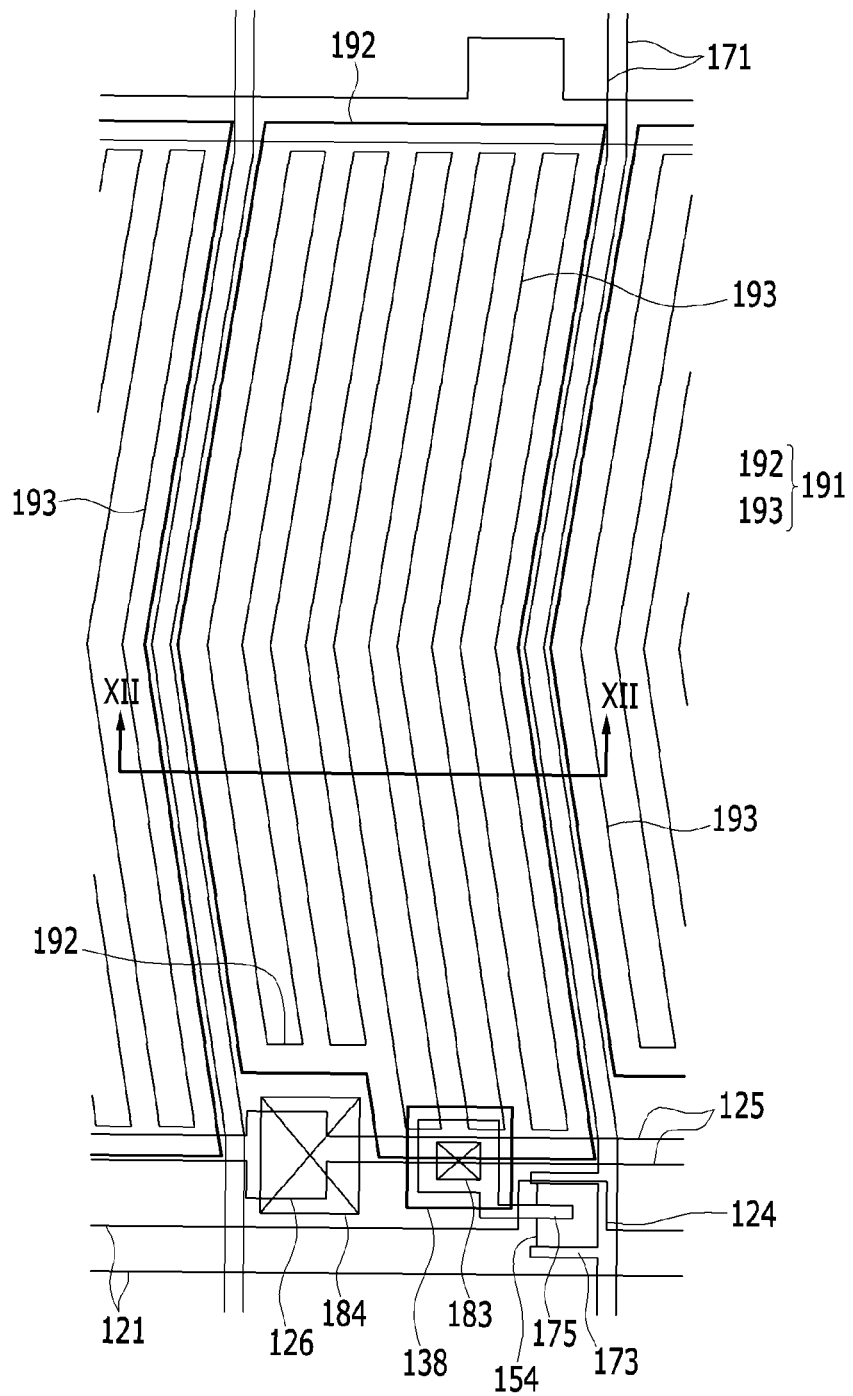
FIG. 11 is a layout view of one pixel in a display area of a thin film transistor array panel according to the fourth exemplary embodiment of the present invention.
Figure 12:
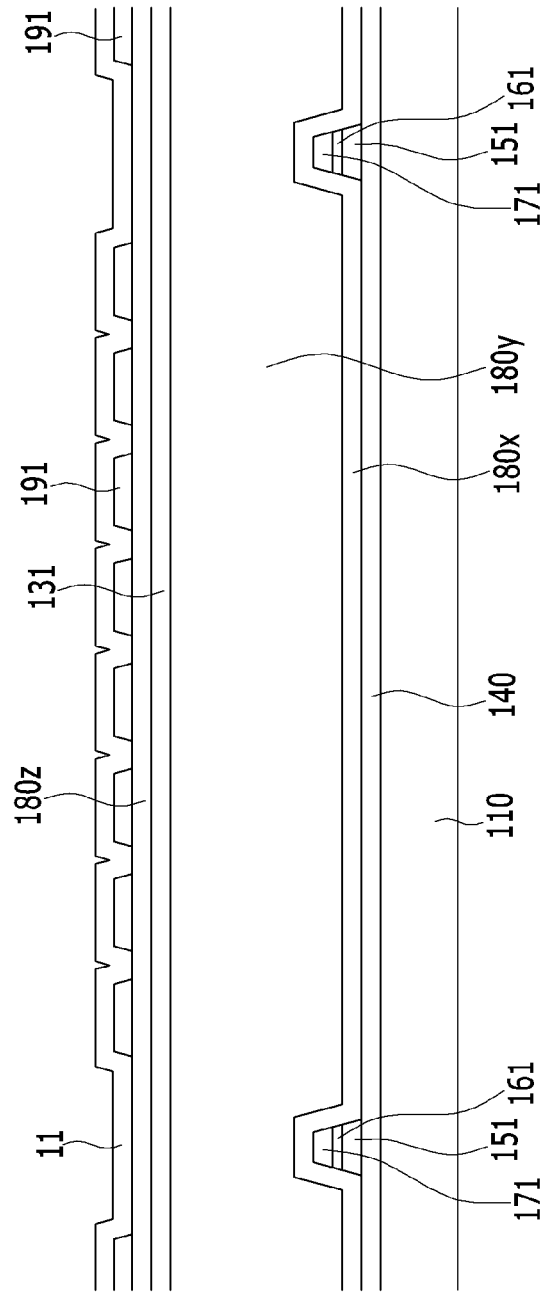
FIG. 12 is a cross-sectional view of the thin film transistor array panel of FIG. 11 taken along the line XII-XII.
Figure 13:
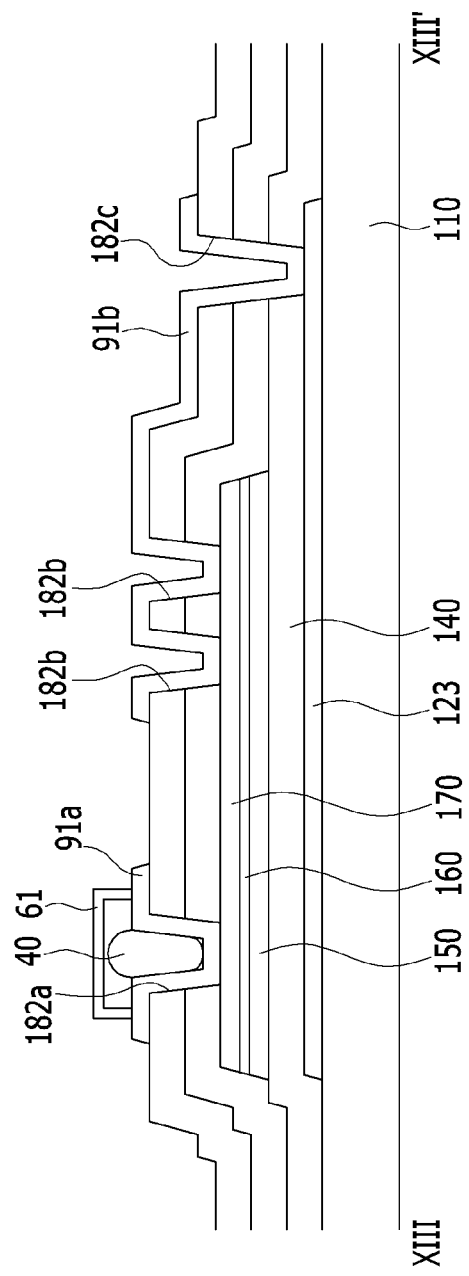
FIG. 13 is a cross-sectional view of the thin film transistor array panel of FIG. 10 taken along the line XIII-XIII'.

Next, a thin film transistor array panel according to another exemplary embodiment of the present invention will be described with reference to FIG. 10 to FIG. 13. FIG. 10 is a layout view of a thin film transistor array panel according to another exemplary embodiment of the present invention, FIG. 11 is a layout view of one pixel in a display area of a thin film transistor array panel according to another exemplary embodiment of the present invention, FIG. 12 is a cross-sectional view of the thin film transistor array panel of FIG. 11 taken along the line XII-XII, and FIG. 13 is a cross-sectional view of the thin film transistor array panel of FIG. 10 taken along the line XIII-XIII'

First, referring to FIG. 10, a thin film transistor array panel according to another exemplary embodiment of the present invention includes a display area 10 to display images, a peripheral area 20 arranged at the periphery of the display area 10, and a driving region 30 disposed near the peripheral area 20, similarly to the thin film transistor array panel of the exemplary embodiment shown in FIG. 1. A driving circuit chip 40 is disposed in the driving region 30, and a driver connection unit 50 which connects a signal line is disposed in the display area 10, and the driving circuit chip 40 of the driving region 30 is disposed in the peripheral area 20.

However, in the thin film transistor array panel according to the present exemplary embodiment, the structure of the peripheral area 20 and the driving region 30 differs from the thin film transistor array panel of the exemplary embodiment shown in FIG. 1. Referring to the enlarged view of a portion of the peripheral area 20 and the driving region 30 in FIG. 10, a plurality of driver connection lines 123, a second driving output pad 51a, an output line 51b extending from the second driving output pad 51a, and a second driving input pad 51c are disposed in the driver connection unit 50. The driver connection lines 123 are formed with the same layer material as the second driving input pad 51c, and are connected to each other.

A first connecting member 91a is formed on a plurality of third driver contact holes 182a exposing portions of the second driving output pad 51a. A second connecting member 91b is disposed on a plurality of fourth driver contact holes 182b exposing a portion of the end of the output line 51b and a plurality of fifth driver contact holes 182c exposing a portion of the second driving input pad 51c. The second driving output pad 51a is connected to the driving circuit chip 40 through a bump (not shown).

Whenever the driving signal is output from the driving circuit chip 40 to the first driving output pad 50b through the bump and the first connecting member 91a, the output driving signal is transmitted through the output line 51b and is transmitted to the second driving input pad 51c connected to the output line 51b by the second connecting member 91b. The driving signal input to the second driving input pad 51c is transmitted through the driver connection lines 123, thereby being transmitted to the signal line of the pixel PX.

Next, the thin film transistor array panel according to the present exemplary embodiment of the present invention will be described with reference to FIGS. 10 to 13.

First, referring to FIG. 11 and FIG. 12, a display area of the thin film transistor array panel according to the present exemplary embodiment is similar to the display area of the thin film transistor array panel according to the exemplary embodiment described with reference to FIG. 6 and FIG. 7.

In detail, a plurality of gate conductors including a plurality of gate lines 121 and a plurality of common voltage lines 125 are formed on the insulation substrate 110, and a gate insulating layer 140 is formed on the gate conductors 121 and 125. A plurality of semiconductors 151 including a plurality of projections 154 are formed on the gate insulating layer 140, and ohmic contacts (not shown) may be formed on the semiconductors 151 and 154. The ohmic contacts may be omitted. A data conductor including a plurality of data lines 171 and a plurality of drain electrodes 175 is formed on the ohmic contacts. A gate electrode 124, a source electrode 173, and a drain electrode 175 form a thin film transistor as a switching element along with the projections 154. The semiconductors 151 and 154 may have almost the same plane shape as the data line 171 and the drain electrode 175 except for the semiconductor 154 including the channel portion of the thin film transistor.

A first passivation layer 180x is positioned on the data conductor 171 and 175 and the exposed portions of the projections 154. A second passivation layer 180y is positioned on the first passivation layer 180x. The second passivation layer 180y includes the organic material and may be formed on the whole surface of the substrate 110 while covering the data lines 171. The surface of the second passivation layer 180y may be substantially flat.

The first passivation layer 180x and the second passivation layer 180y have a first contact hole 181 exposing a portion of the drain electrode 175, and the first passivation layer 180x, the second passivation layer 180y, and the gate insulating layer 140 have a third contact hole 184 exposing a portion of the common voltage line 125.

A common electrode 131 is formed on the second passivation layer 180y. The common electrode 131 is electrically connected to the common voltage line 125 through the third contact hole 184, thereby receiving the predetermined voltage such as the common voltage Vcom from the common voltage line 125. In the present exemplary embodiment, the common electrode 131 may be formed with a plate shape on the entire surface of the substrate 110.

The third passivation layer 180z is formed on the common electrode 131 and the pixel electrode 191 is formed thereon. The first passivation layer 180x, the second passivation layer 180y, and the third passivation layer 180z have a plurality of fourth contact holes 183 exposing a portion of the drain electrode 175, and the pixel electrode 191 is electrically connected to the drain electrode 175 through the first contact hole 181 and the fourth contact hole 183, thereby receiving the data voltage. The pixel electrode 191 includes a plurality of branch electrodes 193 that substantially extend parallel to each other and are spaced apart from each other, and upper and lower horizontal portions 192 that connect a lower end part and an upper end part of the branch electrodes 193. The branch electrodes 193 of the pixel electrode 191 may be curved along the data lines 171.

The data voltage applied to the pixel electrode 191 generates the electric field to the liquid crystal layer 3 along with the common electrode 131 applied with the common voltage.

Next, a portion of the peripheral area and the driving region of the thin film transistor array panel according to an exemplary embodiment of the present invention will be described with reference to FIG. 13 along with FIG. 10.

Referring to FIG. 10 and FIG. 13, a plurality of driver connection lines 123 are formed on the insulation substrate 110. The driver connection lines 123 are made of the gate conductor material. A portion of the driver connection lines 123 forms the second driving input pad 51c.

The gate insulating layer 140 is formed on the driver connection lines 123 and the second driving input pad 51c made of the gate conductor. The second driving output pad 51a and the output line 51b are formed on the gate insulating layer 140. The second driving output pad 51a and the output line 51b include the first layer 150 formed with the same layer material as the semiconductor 151 of the display area, the second layer 160 formed with the same layer material as the ohmic contact of the display area, and the third layer 170 made of the data conductor material of the display area. Here, the second layer 160 may be omitted.

The first passivation layer 180x is disposed on the second output pad 51a, the output line 51b, and the gate insulating layer 140. The third passivation layer 180z is disposed on the first passivation layer 180x. In the case of the thin film transistor array panel according to the present exemplary embodiment, in the peripheral area and the driving region of the display panel, the second passivation layer 180y made of the organic layer is omitted, differently from the display area.

The first passivation layer 180x and the third passivation layer 180z have a plurality of third driver contact holes 182a exposing the second driving output pad 51a and a fourth driver contact hole 182b exposing the portion of the output line 51b. The first passivation layer 180x, the third passivation layer 180z, and the gate insulating layer 140 have a plurality of fifth driver contact holes 182c exposing the second driving input pad 51c.

The first connecting member 91a is disposed on a plurality of the third driver contact holes 182a exposing the portion of the second driving output pad 51a.

A bump 61 is disposed on the first connecting member 91a covering the second driving output pad 51a exposed through the third driver contact hole 182a. Through the bump 61, the driving circuit chip 40 and the second driving output pad 51a are electrically connected to each other.

The second connecting member 91b is disposed on a plurality of the fourth driver contact holes 182b exposing a portion of the end of the output line 51b and a plurality of the fifth driver contact holes 182c exposing the portion of the second driving input pad 51c.

The first connecting member 91a and the second connecting member 91b are formed with the same layer material as the pixel electrode 191.

In the present exemplary embodiment, the first connecting member 91a connecting the second driving output pad 51a and the bump 61, the output line 51b connected to the second driving output pad 51a, and the second connecting member 91b connected to the second driving input pad 51c are formed with the same layer material as the pixel electrode 191. However, the first connecting member 91a and the second connecting member 91b may be formed with the same layer material as the common electrode 131, and not the pixel electrode 191. In detail, the first connecting member 91a and the second connecting member 91b are formed with the same layer material as the field generating electrode that is disposed at the upper side among two field generating electrodes of the thin film transistor array panel. In the case of the thin film transistor array panel of another exemplary embodiment of the present invention, the pixel electrode 191 may be disposed under the third passivation layer 180z and the common electrode 131 may be disposed on the third passivation layer 180z, and in this case, the first connecting member 91a and the second connecting member 91b may be formed with the same layer material as the common electrode 131.

In the thin film transistor array panel according to the present exemplary embodiment, the second driving output pad 51a from which the driving signal is output from the driving circuit chip 40 includes a layer formed with the same layer material as the data conductor of the display area. Accordingly, compared with the case where the second driving output pad 51a is formed of the gate conductor material, a depth of the third driver contact hole 182a exposing the second driving output pad 51a is not relatively deep. Also, the layer made of the gate conductor material is disposed under the second driving output pad 51a including the layer made of the data conductor material such that the depth of the third driver contact hole 182a may be further decreased. Accordingly, the interval between the driving circuit chip 40 and the second driving output pad 51a is not wide, thereby facilitating easy connection using the bump 61. Also, in the thin film transistor array panel according to the present exemplary embodiment, the driver connection lines 123 connecting the driving circuit chip 40 and the display area are formed of the gate conductor material using only one etching process, thereby reducing the width compared with the data conductor formed through two etching processes such that the area of the peripheral area near the display area may be reduced.

Further, in the thin film transistor array panel according to the present exemplary embodiment, the output line 51b (e.g., p of FIG. 10) covered by the passivation layers 180x and 180z is disposed between two neighboring second driving output pads 51a (e.g., x and y of FIG. 10) disposed on the same line in the horizontal direction, not the second driving output pad 51a. That is, two neighboring second driving output pads 51a (e.g., x and z of FIG. 10) are separated in the vertical direction. Therefore, the interval of the neighboring second driving output pads 51a (e.g., x and y of FIG. 10) disposed on the same line in the horizontal direction may be increased. Accordingly, even if a misalignment is generated between the driving pad 40 and the second driving output pad 51a (e.g., x of FIG. 10), the misaligned driving pad 40 overlaps the output line 51b (e.g., p of FIG. 10), not the second driving output pad 51a (e.g., z of FIG. 10), and thereby the crosstalk of the driving signal due to the misalignment between the driving pad 40 and the second driving output pad 51a may be avoided.

In the case of the thin film transistor array panel according to the above-described exemplary embodiments, one of two field generating electrodes which overlap each other has a plate shape and the other includes the branches. However, the present invention may be applied to a thin film transistor array panel of all shapes in which one display panel has two field generating electrodes.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel comprising:
   a substrate comprising a display area and a peripheral area outside the display area;
   a gate line disposed in the display area of the substrate;
   a driver connection line disposed in the peripheral area of the substrate;
   a gate insulating layer disposed on the gate line and the driver connection line;
   a data line disposed on the gate insulating layer and disposed in the display area of the substrate;
   a driving pad disposed on the gate insulating layer and disposed in the peripheral area of the substrate;
   a first insulating layer disposed on the data line and the driving pad;
   a first field generating electrode disposed on the first insulating layer and disposed in the display area of the substrate;
   a connecting member disposed on the first insulating layer and disposed in the peripheral area of the substrate;
   a second insulating layer disposed on the first field generating electrode and the connecting member;

a second field generating electrode disposed on the second insulating layer and disposed in the display area of the substrate; and a dummy electrode layer disposed on the second insulating layer and disposed in the peripheral area of the substrate, wherein the gate line and the driver connection line are formed with the same layer material, the data line and the driving pad are formed with the same layer material, the first field generating electrode and the connecting member are formed with the same layer material, and the second field generating electrode and the dummy electrode layer are formed with the same layer material.

2. The thin film transistor array panel of claim 1, wherein:
the first insulating layer and the second insulating layer comprise a first contact hole exposing the driving pad;
the gate insulating layer, the first insulating layer, and the second insulating layer comprise a second contact hole exposing the driver connection line; and
the connecting member is disposed in the first contact hole and the second contact hole.

3. The thin film transistor array panel of claim 2, wherein a portion of the second insulating layer and a portion of the dummy electrode layer are disposed in the second contact hole.

4. The thin film transistor array panel of claim 3, wherein a bump is disposed in the first contact hole.

5. The thin film transistor array panel of claim 3, wherein a portion of the driver connection line is disposed under the driving pad so as to overlap each other.

6. The thin film transistor array panel of claim 3, wherein the first insulating layer comprises an organic insulator and has a substantially flat surface.

7. The thin film transistor array panel of claim 3, wherein one of the first field generating electrode and the second field generating electrode comprises a plate shape, and the other one of the first field generating electrode and the second field generating electrode comprises a branch electrode.

8. The thin film transistor array panel of claim 2, wherein a bump is disposed in the first contact hole.

9. The thin film transistor array panel of claim 2, wherein a portion of the driver connection line is disposed under the driving pad so as to overlap each other.

10. The thin film transistor array panel of claim 2, wherein the first insulating layer comprises an organic insulator and has a substantially flat surface.

11. The thin film transistor array panel of claim 2, wherein one of the first field generating electrode and the second field generating electrode comprises a plate shape, and the other one of the first field generating electrode and the second field generating electrode comprises a branch electrode.

12. The thin film transistor array panel of claim 1, wherein a portion of the driver connection line is disposed under the driving pad so as to overlap each other.

13. The thin film transistor array panel of claim 1, wherein the first insulating layer comprises an organic insulator and has a flat surface.

14. The thin film transistor array panel of claim 1, wherein one of the first field generating electrode and the second field generating electrode comprises a plate shape, and the other one of the first field generating electrode and the second field generating electrode comprises a branch electrode.

* * * * *